United States Patent [19]

Gofuku et al.

[11] Patent Number: 5,034,569
[45] Date of Patent: Jul. 23, 1991

[54] MULTILAYER INTERCONNECTION CIRCUIT BOARD

[75] Inventors: Eishi Gofuku; Mitsuyuki Tanaka; Yoshiyuki Morihiro; Hayato Takasago, all of Amagasaki, Japan

[73] Assignee: Mitsubishi Denki Kabushiki Kaisha, Tokyo, Japan

[21] Appl. No.: 505,152

[22] Filed: Apr. 5, 1990

[30] Foreign Application Priority Data

Apr. 10, 1989 [JP] Japan .................................. 1-91019

[51] Int. Cl.$^5$ .......................... H05K 1/00; H05K 3/00
[52] U.S. Cl. .................................... 174/254; 174/266; 219/121.65; 219/121.66
[58] Field of Search ...................... 219/121.63, 121.64, 219/121.65, 121.66, 121.67, 121.68, 121.69, 121.70, 121.71; 174/254

[56] References Cited

U.S. PATENT DOCUMENTS 4,627,565 12/1986 Lomerson ...................... 219/121.64
4,644,130 2/1987 Bachmann ...................... 219/121.69

OTHER PUBLICATIONS

IBM J. Res. Develop, vol. 26, No. 1, Jan. 1982, pp. 37–44, D. P. Seraphim, "A New Set of Printed-Circuit Technologies for The IBM 3081 Processor Unit".

Primary Examiner—Leo P. Picard
Assistant Examiner—Trinidad Korka
Attorney, Agent, or Firm—Oblon, Spivak, McClelland, Maier & Neustadt

[57] ABSTRACT

A multilayer interconnection circuit board includes insulating layers and conductor wiring layers which are alternately laminated. The uppermost conductor wiring layer is electrically connected to an intermediate conductor wiring layer to a predetermined stage by irradiating laser beams in the direction of lamination of layers so that the conductor wiring layer or layers located above the intermediate conductor wiring layer are successively molten by the laser beams. The surface irradiated by the laser beams of the conductor wiring layer at the predetermined stage is treated to reflect laser energy, and the surface of the conductor wiring layer or layers which are molten by the laser beams is treated so as to be susceptive to absorb the laser beams.

6 Claims, 3 Drawing Sheets

MULTILAYER INTERCONNECTION CIRCUIT BOARD

BACKGROUND OF THE INVENTION

1. Field of the Invention

The present invention relates to a multilayer interconnection circuit board having an interlayer wiring arrangement formed by irradiating laser beams.

2. Discussion of Background

Recently, a demand of miniaturizing electronic devices and appliances has been increased, and a demand of forming conductors having high density has been required for multilayer interconnection circuit boards. As means for forming highly densed conductors, there has been studied a technique of connecting electrically conductor wiring layers between which insulating layers are interposed.

FIGS. 3a and 3b are respectively cross-sectional views showing a conventional method of connecting layers in a multilayer interconnection circuit board disclosed in, for example, Japanese Unexamined Patent Publication No. 84594/1984. FIG. 4 is a perspective view in order to make FIG. 3a easily understand. In FIGS. 3 and 4, a reference numeral 1 designates an insulating layer made of a polyimide material, a numeral 2 designates a conductor wiring layer made of a material such as copper, a numeral 3 designates a Nd:YAG laser beams, a numeral 4 designates a window formed in the conductor wiring layer 2 in order to irradiate the laser beams, and a numeral 5 designates a char region formed in the insulating layer 1 of polyimide by irradiating the YAG laser beams 3.

When the YAG laser 3 is irradiated through the window 4, a part of the insulating layer 1 of polyimide is charred, whereby two conductor wiring layers interposing the insulating layer 1 therebetween are electrically connected through the char region 5.

FIGS. 3a and 4 shows an example wherein the window 4 is formed in a conductor wiring layer 1. However, an example wherein the conductor wiring layer 1 has no window 4 can be considered. In this case, the electrical connection of two conductor wiring layers is performed as follows. An laser output is increased so that the upper conductor wiring layer 1 is molten. Then, the laser output is returned to the original level, and a char region 5 is formed in the same manner as that as shown in FIG. 3b.

In the conventional technique of electrically connecting the multilayer interconnection circuit board described above, it was necessary to adjust a laser output depending on the presence or absence of the window 4. There was, therefore, a problem that a high speed machining operation could not be obtained.

SUMMARY OF THE INVENTION

It is an object of the present invention to provide a multilayer interconnection circuit board which allows high speed operation manufacturing.

The foregoing and other objects of the present invention have been attained by providing a multilayer interconnection circuit board comprising insulating layers and conductor wiring layers which are alternately laminated wherein the uppermost conductor wiring layer is electrically connected to an intermediate conductor wiring layer to a predetermined stage by irradiating laser beams in the direction of lamination of layers so that the conductor wiring layer or layers located above the intermediate conductor wiring layer are successively molten by the laser beams, characterized in that the surface irradiated by the laser beams of the conductor wiring layer at the predetermined stage is treated to reflect laser energy, and the surface of the conductor wiring layer or layers which are molten by the laser beams is treated so as to be susceptive to absorb the laser beams.

BRIEF DESCRIPTION OF DRAWINGS:

A more complete appreciation of the invention and many of the attendant advantages thereof will be readily obtained as the same becomes better understood by reference to the following detailed description when considered in connection with the accompanying drawings, wherein:

FIG. 4 is a perspective view of the multilayer interconnection circuit board shown in FIG. 3a.

DETAILED DESCRIPTION OF THE PREFERRED EMBODIMENTS

Figure 1A:
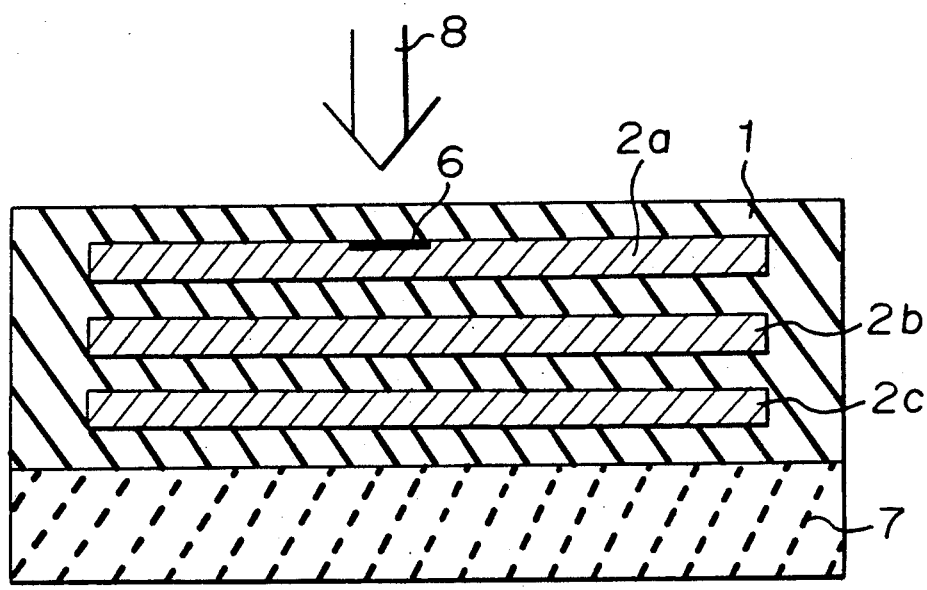
FIGS. 1a and 1b are diagrams showing an embodiment of the method of forming a multilayer interconnection circuit board according to the present invention.
Figure 1B:
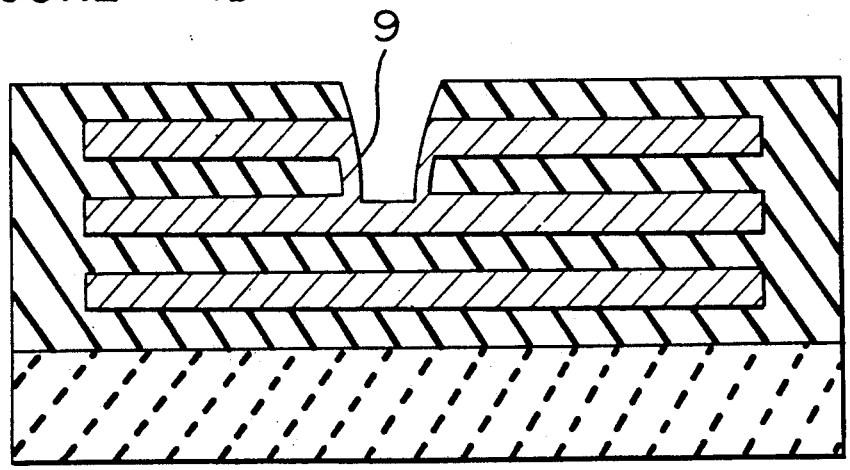

Referring to the drawings, wherein the same reference numerals designate the same or corresponding parts throughout the several views, and more particularly to FIG. 1 thereof, there is shown diagrams of a typical example of the multilayer interconnection circuit board of the present invention, wherein FIGS. 1a shows a state of a multilayer interconnection circuit board before subjecting to laser processing and FIG. 1b shows a state after the laser processing. In FIGS. 1a and 1b, a reference numeral 1 designates an insulating layer made of a polyimide material, numerals 2a, 2b and 2c designate respectively first, second and third conductor wiring layers made of a material capable of reflecting laser beams, such as electroplated foil of copper, a numeral 6 designates a roughened area which is previously selected and is formed by, for instance, masking a resist pattern prepared by using photoengraving process and by treating with an appropriate etching liquid, a numeral 7 designates an alumina ceramic substrate, and a numeral 8 designates laser beams such as an Xe pulse laser oscillated to give a green color.

A working example of the multilayer interconnection circuit board having the construction described above will be explained.

The Xe pulse laser having an output of b 0.1 mJ/P is irradiated to the roughened area 6 from the above. The Xe pulse laser perforates the insulating layer of polyimide without forming a char region. The function of the Xe pulse laser is different from that of the YAG laser. The Xe pulse laser having an output of 0.1 mJ/P or so is reflected by the electroplated foil of copper without having a roughened area, and there is no danger of perforating the electroplated foil of copper. However, an electroplated foil of copper wherein a treatment for absorbing laser energy, such as for forming a roughened area absorbs the laser energy even by using the laser output of the same level (i.e. about 0.1 mJ/P), whereby perforation processing is possible.

When the irradiation of the Xe pulse laser is continued, a hole is formed in the polyimide material located above the conductor wiring layer 2a having an electroplated foil of copper, during which the laser energy is absorbed to the roughened area 6. When the irradiation of the laser is continued while the focal point of the laser is moved downwardly, a portion of the polyimide material on an above the roughened area in the second conductor wiring layer 2b is perforated. When the laser reaches the surface of the second conductor wiring layer 2b, the molten electroplated material of the first conductor wiring layer 2a comes in contact with the second conductor wiring layer 2b and is electrically connected therewith, whereby there is formed an electrically connection portion 9. Since the laser is reflected by the second conductor wiring layer 2b, there is no danger of progressing the perforating operation even though the irradiation of the laser is continued, and the insulating layer or layers and the electroplated conductor wiring layer 2c underneath the second conductor wiring layer 2b are not processed.

Figure 2A:
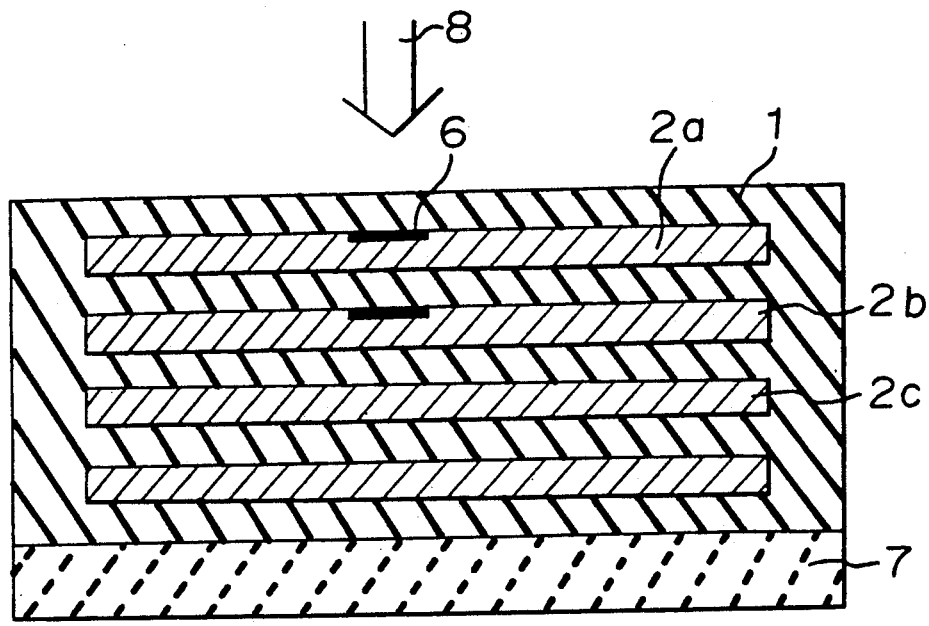
FIG. 2a and 2b are diagrams showing another embodiment of the method of forming a multilayer interconnection circuit board according to the present invention.
Figure 2B:
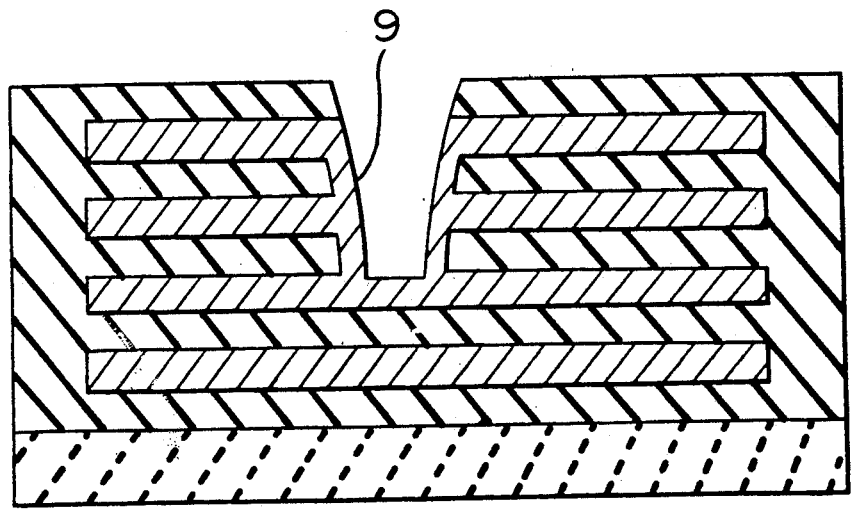
Figure 3A:
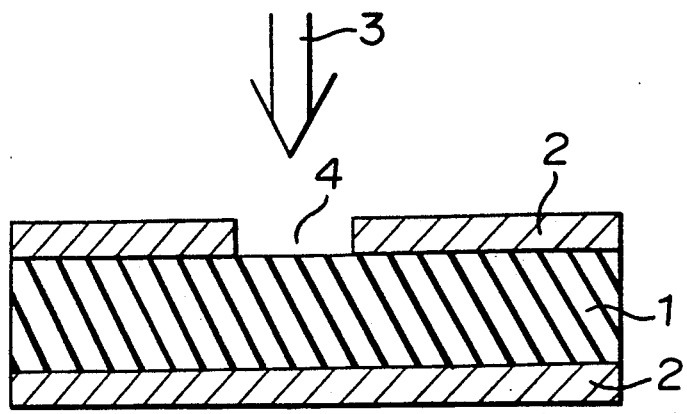
FIGS. 3a and 3b are diagrams showing a conventional method of forming a multilayer interconnection circuit board.
Figure 3B:
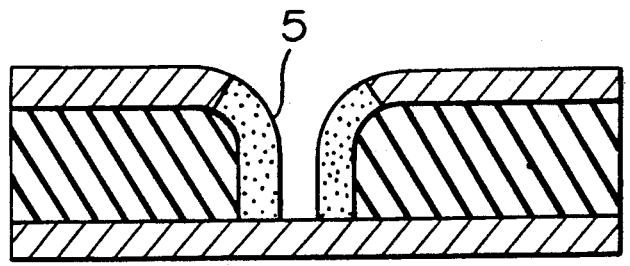
Figure 4:
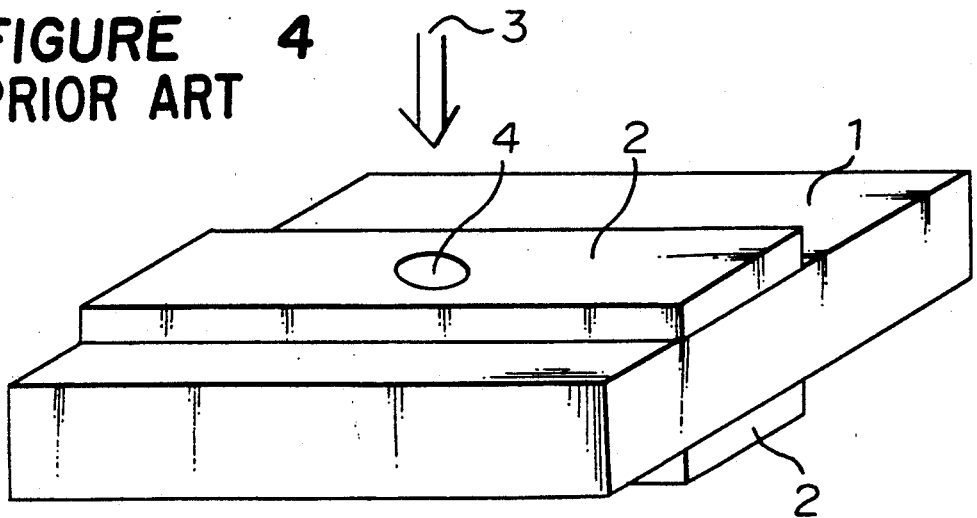

FIGS. 2a and 2b are respectively diagrams showing another embodiment of processing the circuit board of the present invention. In the first embodiment as shown in FIGS. 1a and 1b, the roughened area 6 is formed only on the surface of the first conductor wiring layer 2a made of an electroplated foil of copper. In this embodiment, however, a roughened area is formed on the upper surface of the second conductor wiring layer 2b so as to be just below the roughened area 6 of the first conductor wiring layer 2a. In the second embodiment, the processing of perforation is conducted to the conductor wiring layer of the lowert stage which has a roughened area. When the conductor wiring layer of the second stage is to be processed, the same condition of laser output level as for the first stage can be used. Accordingly, it is unnecessary to adjust the output of laser. Therefore, the processing of perforation can be achieved at a high speed. Further, since the processing is carried out with the same output level of laser, the diameter of holes formed by laser can be uniform.

In the above-mentioned embodiments, the treatment of roughening the surface of at least one conductor wiring layer is exemplified as a treatment to absorb laser energy. However, the same effect can be obtained by using another treatment such as a treatment of oxidization, a treatment of vulcanization or the like.

In the above-mentioned embodiments, a multilayer interconnection circuit board is obtained by subjecting partially a material susceptive to reflect laser energy to a treatment to absorb the laser energy, followed by subjecting the material to laser processing. However, such multilayer interconnection circuit board can be obtained by subjecting a material susceptive to absorb the laser energy to a treatment to reflect the laser energy so that the progress of the laser processing to the lower stage is prohibited. As a material susceptive to absorb the laser energy, a self-catalytic copper foil precipitated from alkaline solution for chemical copper plating may be used. As an example of the treatment of the treatment of reflecting the laser energy on the copper foil, there is, for instance, a treatment of forming an electroplated layer of copper having a thickness of 0.5 μm.

In the above-mentioned embodiments, explanation has been made as to the conductor wiring layer wherein a treatment of absorbing laser energy is selectively applied to a material susceptive to reflect the laser energy, or the conductor wiring layer wherein a treatment of reflecting the laser energy is selectively conducted to a material susceptive to absorb the laser energy. However, the same effect can be obtained by applying a treatment of absorbing the laser energy to a portion of a material where laser processing is to be carried out, and by applying a treatment of reflecting the laser energy to a portion where the laser processing has not to be carried out in a case that a material for the conductor wiring layer which may reflect or may absorb laser beams, such as copper formed by a sputtering method, is used.

In the processing by using the Xe pulse laser in the above-mentioned embodiments, it is possible to use the pulse laser having an output in a range of 0.1 mJ/P ±20%.

Further in the above-mentioned embodiments, copper is used for a material for the conductor wiring layer. However, another material such as nickel, aluminum or the like may be used. As a material for the insulating layer, an organic material such as epoxy or an inorganic material such as alumina ceramic may be used instead of polyimide.

As the laser oscillated in a form of pulses in the embodiments of ht present invention, the second harmonics of a Nd:YAG laser may be used instead of the Xe laser. Another kind of laser may be used in consideration of a state of the material and the surface of a conductor wiring layer and the material of insulating layer to be used.

Thus, in accordance with the multilayer interconnection circuit board of the present invention, the same condition of laser can be used for forming electrically connecting portion in it, and the processing of perforation and electric connection in the circuit board can be conducted at a high speed.

Obviously, numerous modifications and variations of the present invention are possible in light of the above teachings. It is therefore to be understood that within the scope of the appended claims, the invention may be practiced otherwise than as specifically described herein.

What is claimed is:

1. A multilayer interconnection circuit board comprising:
   a plurality of insulation layers alternately laminated with a plurality of conductor wiring layers wherein each of said plurality of insulating layers absorbs laser energy and wherein each of said plurality of conductive wiring layers reflect laser energy with at least one of said plurality of conductor wiring layers containing a treated portion wherein said treated portion absorbs laser energy whereby said at least one conductor wiring layer is electrically interconnected to an adjacent conductor wiring layer when said treated portion is exposed to laser energy.

2. A multilayer interconnection circuit board comprising:
   a plurality of insulator layers which absorb laser energy alternately laminated with a plurality of conducting wire layers wherein said plurality of conductive wire layers each absorbed laser energy with one of said plurality of conducting wire layers containing a treated portion wherein said treated portion reflects laser energy whereby a first plurality of conducting layers are interconnected when said board is exposed to laser energy wherein said first plurality includes said one conducting wire layer having said treated portion and those of said plurality of conducting wires positioned between said conducting wire having said treated portion and a source of laser energy when said source of laser energy is perpendicular to said board and aligned with said treated portion.

3. The multilayer interconnection circuit board according to claim 1, wherein the conductor wiring layer which reflects laser energy has an electrically plated copper layer.

4. The multilayer interconnection circuit board according to claim 1, wherein the treated portion to absorb laser energy has a selectively roughened area.

5. The multilayer interconnection circuit board according to claim 1, wherein the conductor wiring layer to reflect laser beams is made of a material susceptive to absorb the laser beams and a layer to reflect the laser beams is formed on the upper surface of the conductor wiring layer.

6. The multilayer interconnection circuit board according to claim 5, wherein the material susceptive to absorb laser energy is a self-catalytic copper foil precipitated from alkaline solution for chemical copper plating.

* * * * *